(12) United States Patent
Ruff et al.

(10) Patent No.: US 6,515,531 B2
(45) Date of Patent: Feb. 4, 2003

(54) MULTICHIP CONFIGURATION

(75) Inventors: Martin Ruff, Vestenbergsgreuth; Benno Weis, Hemhofen, both of (DE)

(73) Assignee: Europaeische Gesellschaft fuer Leistungshalbleiter mbH & Co. KG, Warstein-Belecke (DE)

(*) Notice: Subject to any disclaimer, the term of this patent is extended or adjusted under 35 U.S.C. 154(b) by 0 days.

(21) Appl. No.: 09/894,679

(22) Filed: Jun. 28, 2001

(65) Prior Publication Data

US 2002/0003717 A1 Jan. 10, 2002

(30) Foreign Application Priority Data

Jun. 28, 2000 (DE) .......................... 100 31 462

(51) Int. Cl.$^7$ ................................ H03K 5/08
(52) U.S. Cl. ................ 327/310; 327/309; 327/434
(58) Field of Search ................... 327/309, 310, 327/312, 313, 314, 315, 317, 318–321, 324, 325, 327, 328, 564–566, 427, 434, 438, 379, 389, 109

(56) References Cited

U.S. PATENT DOCUMENTS

| 4,207,478 A | 6/1980 | Marumoto et al. | ......... 307/240 |
|---|---|---|---|
| 4,631,474 A | * 12/1986 | Dolland | ....................... 327/432 |
| 5,227,655 A | 7/1993 | Kayama | ....................... 257/380 |
| 5,949,273 A | * 9/1999 | Mourick et al. | ............. 327/324 |

FOREIGN PATENT DOCUMENTS

| DE | 32 30 079 A1 | 2/1984 |
|---|---|---|
| DE | 196 28 131 A1 | 1/1998 |
| DE | 197 26 765 A1 | 1/1999 |
| EP | 0 352 516 A2 | 1/1990 |
| EP | 0 959 563 A2 | 11/1999 |

OTHER PUBLICATIONS

"Mise en Parallele de MOSFET", 2045 Electronique, Mar. 1994, No. 36, Paris, France, (Parallel Switching of MOSFET's).

* cited by examiner

Primary Examiner—Toan Tran
(74) Attorney, Agent, or Firm—Laurence A. Greenberg; Werner H. Stemer; Ralph E. Locher

(57) ABSTRACT

A multichip configuration in which a plurality of semiconductor chips in a module are connected together in such a way that the voltage drop across internal gate resistors is minimized, in order in the event of a short circuit to prevent the short circuit current rising with the gate voltage.

6 Claims, 3 Drawing Sheets

MULTICHIP CONFIGURATION

BACKGROUND OF THE INVENTION

FIELD OF THE INVENTION

The present invention relates to a multichip configuration containing a multiplicity of semiconductor chips which are connected in parallel with one another in a module and whose control terminals are jointly connected, first, to an external driver circuit and, second, to a clamping device.

A multichip configuration containing semiconductor chips connected in parallel with one another in a module or in a wafer cell is known. Implemented in each of the semiconductor chips is, as an example of a power semiconductor component, an insulated gate bipolar transistor (IGBT). Instead of such an IGBT, another power semiconductor component can also be embodied, such as a MOS field effect power transistor, a thyristor or the like.

Gate terminals of the chips are combined at a point in the module, the point being connected to an external gate terminal of the module. The external gate terminal is therefore available externally to a user of the module.

In order then to avoid oscillations between the individual chips, there is between each gate terminal of the individual chips and the actual gate electrode of the IGBT a resistor. Therefore, between two gates of the chips, there is always a series circuit of two resistors. If, for example, the chips are considered, the series circuit contains the resistors, which are connected to each other via the gate terminal, the point and the gate terminal.

A user will connect the module gate terminal to an external driver stage that, inter alia, has a series circuit containing a first switch, a first resistor, a second resistor and a second switch between a positive voltage source and a negative voltage source. The gate terminal is in this case connected to the junction between the two resistors and can therefore—depending on the position of the switches—have applied to it the potential from the positive voltage source, reduced by the voltage drop across the resistor, the potential of the negative voltage source, reduced by the voltage drop across the resistor, and a potential lying between the potential of the positive voltage source and the potential of the negative voltage source, corresponding to the resistor ratio of the resistors.

In addition, the module gate terminal is also connected to a clamping device, which has the task, in the event of a short circuit for example between an external collector terminal and an external emitter terminal of the module, as far as possible of preventing any rise in a gate voltage, that is to say the gate voltage of the chips. The external clamping device contains a series circuit of a zener diode with a capacitor between a fixed potential and a voltage source. A junction at the clamping voltage between the diode and the capacitor is connected to the module gate terminal via a clamping diode.

If a short circuit occurs on the output side of the module, then the voltage between the collector terminal and the emitter terminal rises. The voltage change effects a current flow (Miller current) through the Miller capacitors, as they are known. The current through the Miller capacitors must flow through the gate resistors before it can be dissipated into the large clamping capacitor through the clamping diode. Starting from the potential at the junction between the zener diode and the large clamping capacitor, the potential being kept approximately constant by the large clamping capacitor, irrespective of the level of the current through the Miller capacitors, there is further added the voltage drop across the clamping diode, which may be about 0.7 V, and the voltage drop across the internal gate resistors, which rises linearly with the Miller current caused by the Miller capacitors.

Attention then has to be paid to the fact that the actual gate voltage on the individual chips of the module cannot be measured directly in the module by a user. However, in the event of a short circuit, the short circuit current of the power semiconductor component, in the present example the respective IGBT, rises very sharply with the gate voltage.

The voltage drop across the internal gate resistors contributes to a not inconsiderable extent to the increased short circuit current and therefore to high loading on the power semiconductor component or the module, until the latter is destroyed.

The minimum level of the clamping voltage cannot be reduced further, since the power semiconductor component, in the normal conductive state, needs a minimum gate voltage of, for example, 15 V for good forward behavior.

SUMMARY OF THE INVENTION

It is accordingly an object of the invention to provide a multichip configuration that overcomes the above-mentioned disadvantages of the prior art devices of this general type, in which an increase in the short circuit current as a result of internal gate resistors is avoided.

With the foregoing and other objects in view there is provided, in accordance with the invention, a multichip configuration. The multichip configuration includes a module containing a gate/clamping terminal, a multiplicity of semiconductor chips connected in parallel and having a plurality of gate terminals and, a plurality of parallel circuits each having a resistor and a diode connected in parallel with one another forming a respective one of the parallel circuits. The parallel circuits each have a first side jointly connected to the gate/clamping terminal and a second side connected to one of the gate terminals. A driver circuit is connected to the gate/clamping terminal and a clamping circuit is connected to the gate/clamping terminal.

According to the invention, the object is achieved in a multichip configuration of the type mentioned at the beginning by the control terminals each being connected via a resistor to the driver circuit and each being connected via a diode to the clamping device. Given such wiring of the multichip configuration, internal gate resistors in the latter can be dispensed with, so that the voltage drop across these is minimized or can be neglected.

In a first advantageous development of the invention, provision is made for each semiconductor chip to be assigned one module gate terminal, and for the resistors and the diodes to be disposed outside the module.

A second advantageous development of the invention is distinguished by the fact that the module has a gate terminal and a clamping terminal, and in that within the module in each case the resistors of the semiconductor chip and the diodes of the semiconductor chip are jointly connected to the gate terminal and to the clamping terminal, respectively.

Finally, in a third advantageous development of the invention, provision is made for the module to have a gate and clamping terminal, within each semiconductor chip for the respective resistors and diodes to be connected in parallel with one another. The respective parallel circuits of the resistors and diodes of the individual semiconductor chips are connected jointly to the gate and clamping terminal.

In accordance with an added feature of the invention, the semiconductor chips each contains an insulated gated bipolar transistor, a MOS power transistor, a thyristor, or the like.

In accordance with an additional feature of the invention, the semiconductor chips contain a plurality of Miller capacitors.

In accordance with another feature of the invention, the resistor and/or the diode of the respective one of the parallel circuits is integrated on a respective one of the semiconductor chips.

In accordance with a further feature of the invention, the resistor and/or the diode of the respective one of the parallel circuit is implemented discretely from a respective one of the semiconductor chips.

In accordance with a concomitant feature of the invention, the driver circuit and the clamping circuit are an integrated single circuit.

Other features which are considered as characteristic for the invention are set forth in the appended claims.

Although the invention is illustrated and described herein as embodied in a multichip configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
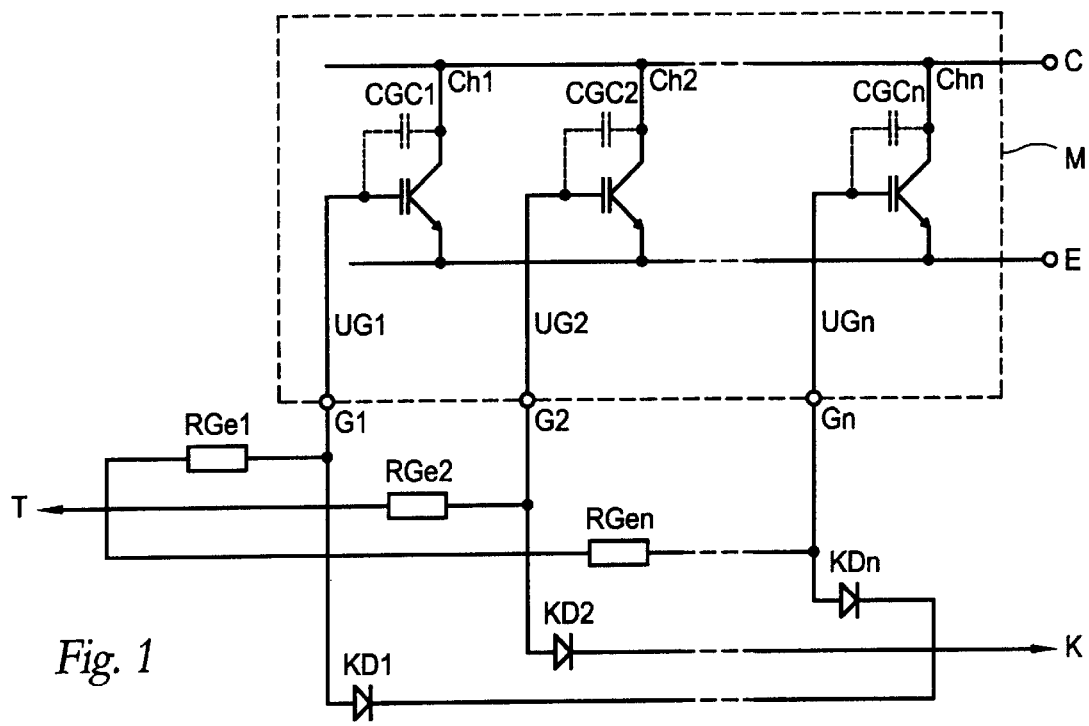
FIG. 1. is a circuit diagram of a first exemplary embodiment of a multichip configuration according to the invention.

In all the figures of the drawing, sub-features and integral parts that correspond to one another bear the same reference symbol in each case. Referring now to the figures of the drawing in detail and first, particularly, to FIG. 4 thereof, there shown a multichip configuration containing n semiconductor chips Ch1, Ch2, . . . , Chn connected in parallel ith one another in a module M or in a wafer cell. Implemented in each of the semiconductor chips Ch1, Ch2, Chn is, as an example of a power semiconductor component, an insulated gate bipolar transistor (IGBT). Instead of such an IGBT, another power semiconductor component can also be embodied, such as a MOS field effect power transistor, a thyristor or the like.

Gate terminals LG1, LG2, . . . , LGn of the chips Ch1, Ch2, . . . Chn are combined at a point P in the module M, the point P being connected to an external gate terminal G of the module M. The external gate terminal G is therefore available externally to a user of the module M.

In order then to avoid oscillations between the individual chips Ch1, Ch2, . . . , Chn, there is between each gate terminal LG1, LG2, . . . , LGn of the individual chips Ch1, Ch2, . . . , Chn and an actual gate electrode of the IGBT a resistor RG1, RG2, . . . , RGn. Therefore, between two gates of the chips, there is always a series circuit of two resistors. If, for example, the chips Ch1 and Ch2 are considered, the series circuit contains the resistors RG1 and RG2, which are connected to each other via the gate terminal LG1, the point P and the gate terminal LG2.

A user will connect the module gate terminal G to an external driver stage T which, inter alia, has a series circuit containing a first switch S1, a first resistor R1, a second resistor R2 and a second switch S2 between a positive voltage source PS and a negative voltage source NS. The gate terminal G is in this case connected to the junction between the two resistors R1 and R2 and can therefore—depending on the position of the switches S1 and S2—have applied to it the it potential from the positive voltage source PS, reduced by the voltage drop across the resistor R1, the potential of the negative voltage source NS, reduced by the voltage drop across the resistor R2, and a potential lying between the potential of the positive voltage source PS and the potential of the negative voltage source NS, corresponding to the resistor ratio of the resistors R1 and R2.

In addition, the module gate terminal G is also connected to a clamping device K, which has the task, in the event of a short circuit for example between an external collector terminal C and an external emitter terminal E of the module M, as far as possible of preventing any rise in a gate voltage UG. That is to say the gate voltage UG1 of the chip Ch1, the gate voltage UG2 of the chip Ch2, . . . and the gate voltage UGn of the chip Chn. The external clamping device K contains a series circuit of a zener diode Z with a capacitor C1 between a fixed potential P1 and a voltage source E (N). A junctio Uk at the clamping voltage UK between the diode Z and the capacitor C1 being connected to the module gate terminal G via a clamping diode KD.

If a short circuit occurs on the output side of the module M, then the voltage between the collector terminal C and the emitter terminal E rises. The voltage change effects a current flow (Miller current) through the n Miller capacitors CGC1, CGC2, . . . , CGCn, as they are known, which are indicated schematically by dashed lines in FIG. 4. The current through the Miller capacitors CGC1, CGC2, . . . , CGCn must flow through the n gate resistors RG1, RG2, . . . , RGn before it can be dissipated into the large clamping capacitor C1 through the clamping diode KD. Starting from the potential UK at the junction Uk between the zener diode Z and the large clamping capacitor C1, the potential is kept approximately constant by the large clamping capacitor C1, irrespective of the level of the current through the Miller capacitors CGC1, CGC2, . . . , CGCn, there is further added the voltage drop across the clamping diode KD, which may be about 0.7 V, and the voltage drop across the internal gate resistors RG1, RG2, . . . , RGn, which rises linearly with the Miller current caused by the Miller capacitors.

Figure 5:
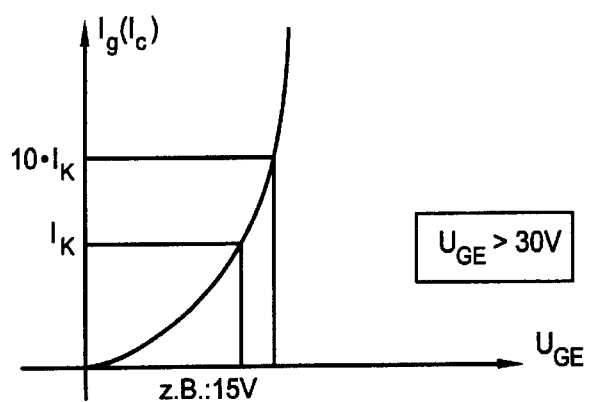
FIG. 5. is a graph showing a course of a short circuit current of a power semiconductor component as a function of a gate-emitter voltage.

Attention then has to be paid to the fact that the actual gate voltage on the individual chips Ch1, Ch2, . . . , Chn of the module M cannot be measured directly in the module M by a user. However, in the event of a short circuit, the short circuit current of the power semiconductor component, in the present example the respective IGBT, rises very sharply with the gate voltage, as can be seen from FIG. 5, in which the logarithm lg of the collector current Ic is plotted as a function of the gate-emitter voltage UGE, the collector-emitter voltage $_{UCE}$ being more than 30 V. The gate-emitter voltage UGE of, for example, 15 V leads to a collector current Ic with the magnitude IK. If the gate-emitter voltage UGE is increased only slightly, then the result for the collector current Ic is already a value which is ten times the current IK.

The voltage drop across the internal gate resistors RG1, RG2, ..., RGn contributes to a not inconsiderable extent to the increased short circuit current and therefore to high loading on the power semiconductor component or the module, until the latter is destroyed.

The minimum level of the clamping voltage UK cannot be reduced further, since the power semiconductor component, in the normal conductive state, needs a minimum gate voltage of, for example, 15 V for good forward behavior.

In the exemplary embodiment of FIG. 1 and according to the invention, the module M has n gate terminals G1, G2, ..., Gn, which are each connected directly, without the internal gate resistors RG1, RG2, ..., RGn (compare to FIG. 4), to the gates of the IGBTs of the semiconductor chips Ch1, Ch2, ..., Chn of the module M. The n gate terminals G0, G2, ..., Gn are connected via n clamping diodes KD1, KD2, ..., KDn to a clamping device K, which corresponds to the clamping device K from FIG. 4 without the clamping diode KD there. Therefore, kD the output of the clamping diodes KD1, KD2, ... KDn is connected to the point Uk of the clamping device K. In addition, the gate terminals G1, G2, ..., Gn of the module M are connected to the driver circuit T via n external gate resistors RGe1, RGe2, ..., RGen (compare to FIG. 4). The gate resistors RGe1, RGe2, ..., RGen ensure the decoupling of the gate terminals G1, G2, ..., Gn.

Figure 2:
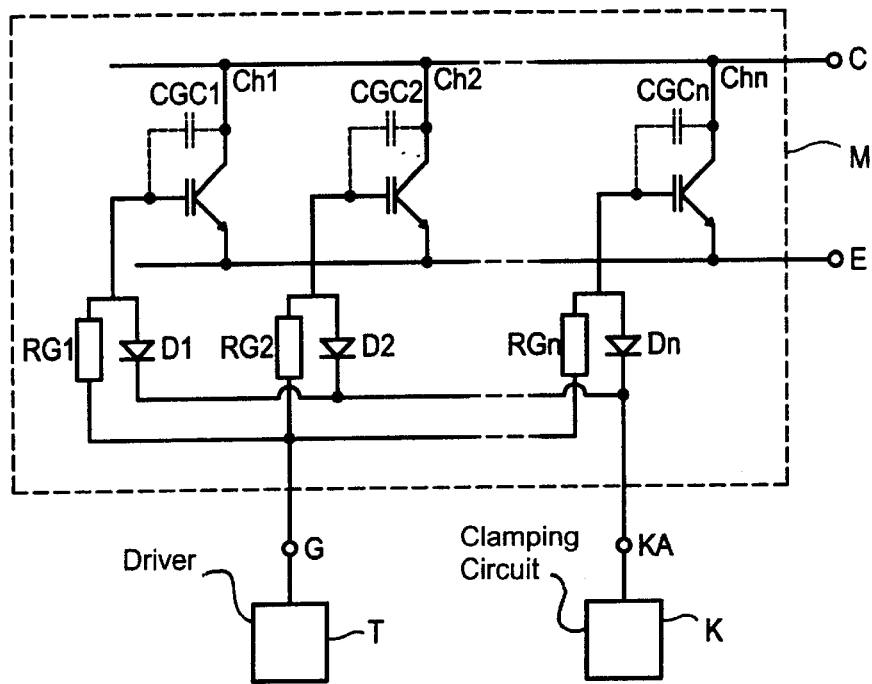
FIG. 2. is a circuit diagram of a second exemplary embodiment of the multichip configuration according to the invention.

FIG. 2 shows an embodiment of the present invention, in which the n gate terminals G1, G2, ..., Gn of the exemplary embodiment of FIG. 1 are already connected to one another internally. As opposed to the conventional module of FIG. 4, in this case diodes D1, D2, ..., Dn are additionally located in parallel with the gate resistors RG1, RG2, ..., RGn, their cathodes being connected together and to a single clamping terminal KA of the module M. The clamping device K is connected to the clamping terminal KA, while the driver circuit T is connected to a common gate terminal G of the module M.

In the exemplary embodiment of FIG. 2, the clamping device K itself no longer needs a clamping diode KD (compare to FIG. 4), so that the voltage of the gates of the individual semiconductor chips Ch1, Ch2, ..., Chn rises above that of the clamping capacitor C1 by only about 0.7 V, irrespective of the level of the Miller current.

As compared with the configuration of FIG. 1, the advantage with the configuration of FIG. 2 is the lower number of requisite terminals; instead of the n gate terminals G1, G2, ..., Gn of the exemplary embodiment of FIG. 1, only the gate terminal G and the clamping terminal KA for the module M are needed. The resistors RG1, RG2, ..., RGn and/or the diodes D1, D2, ..., Dn can be integrated on the respective semiconductor chip Ch1, Ch2, ..., Chn or implemented discretely.

Figure 3:
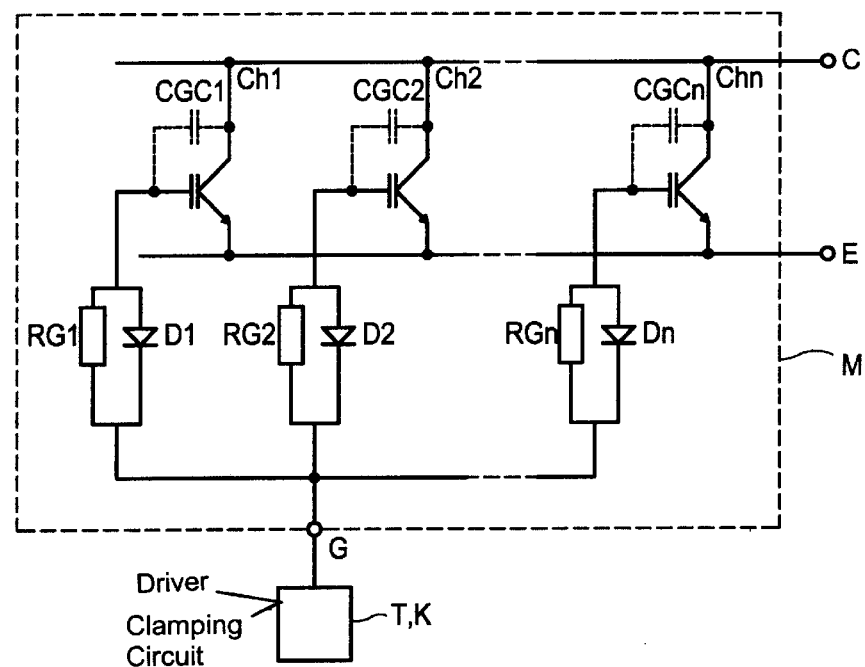
FIG. 3. is a circuit diagram of a third exemplary embodiment of the multichip configuration according to the invention.
Figure 4:
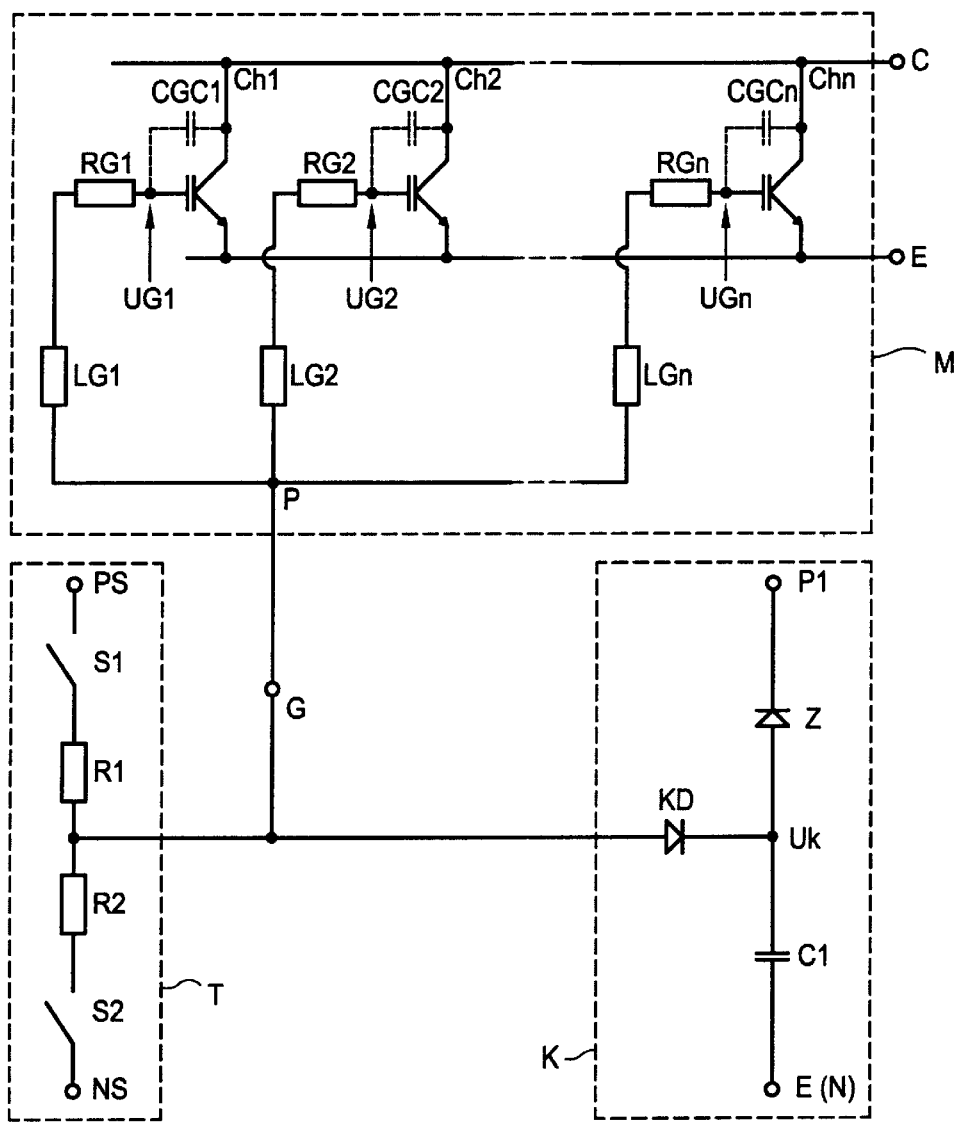
FIG. 4. is a circuit diagram of a known multichip configuration according to the prior art.

FIG. 3 shows a further exemplary embodiment of the multichip configuration according to the invention, in which, as compared with the conventional chip configuration of FIG. 4, no additional module terminal for the module M is needed at all. Here, the diodes D1, D2, ..., Dn are each connected directly in parallel with their associated gate resistor RG1, RG2, ..., RGn, which renders the clamping terminal KA dispensable. However, the clamping device K again needs a clamping diode KD (see FIG. 4), since the gate terminal G is at the emitter potential when switched off, and would otherwise discharge the clamping capacitor C1. When dimensioning the driver circuit T, it is necessary to take account of the fact that the internal gate resistor RG1, RG2, ..., RGn are added to the external gate resistor in the connection between the gate terminal G and the driver circuit be T only when the module M is switched on, while when the latter is switched off, the diodes D1, D2, ..., Dn act with a virtually constant voltage drop. The overcharging of the gates of the individual semiconductor chips Ch1, Ch2, ..., Chn with respect to the clamping voltage UK at the junction Uk of the clamping device K (see FIG. 4) is about twice the forward voltage drop across a diode D1, D2, ..., Dn, that is to say about 1.4 V, and is virtually independent of the level of the Miller current.

The resistors RG1, RG2, ..., RGn and/or the diodes D1, D2, ..., Dn can be integrated on the respective semiconductor chip Ch1, Ch2, ..., Chn, as in the exemplary embodiment of FIG. 2, or else implemented discretely. In each case, however, the resistors and diodes are located within the module M.

A particular advantage of the exemplary embodiments of FIGS. 2 and 3 is the fact that the gate resistors RG1, RG2, ..., RGn and the respective clamping diodes D1, D2, ..., Dn are integrated on the corresponding chips Ch1, Ch2, ..., Chn, which reduces the number of components. In the exemplary embodiment of FIG. 3, in addition, no additional bonding wire is required, since there is only one terminal G.

For purposes of simplification, in the exemplary embodiment of FIG. 3, the driver circuit T and the clamping device K are further illustrated as being combined in one block T, K. If appropriate, these circuits T and K can also be integrated in one unit.

We claim:

1. A multichip configuration, comprising:
   a module containing a gate/clamping terminal, a multiplicity of semiconductor chips connected in parallel and having a plurality of gate terminals and, a plurality of parallel circuits each having a resistor and a diode connected in parallel with one another forming a respective one of said parallel circuits, said parallel circuits each having a first side jointly connected to said gate/clamping terminal and a second side connected to one of said gate terminals;
   a driver circuit connected to said gate/clamping terminal; and
   a clamping circuit connected to said gate/clamping terminal.

2. The multichip configuration according to claim 1, wherein said semiconductor chips each contain a device selected from the group consisting of insulated gated bipolar transistors, MOS power transistors, and thyristors.

3. The multichip configuration according to claim 1, wherein said semiconductor chips contain a plurality of Miller capacitors.

4. The multichip configuration according to claim 1, wherein at least one of said resistor and said diode of said respective one of said parallel circuits is integrated on a respective one of said semiconductor chips.

5. The multichip configuration according to claim 1, wherein at least one of said resistor and said diode of said respective one of said parallel circuit is implemented discretely from a respective one of said semiconductor chips.

6. The multichip configuration according to claim 1, wherein said driver circuit and said clamping circuit are an integrated single circuit.

* * * * *